(12) United States Patent
Nilson

(10) Patent No.: US 6,342,799 B1
(45) Date of Patent: Jan. 29, 2002

(54) ERROR CORRECTING PROGRAMMABLE PULSE GENERATOR

(75) Inventor: Chris Nilson, San Jose, CA (US)

(73) Assignee: Level One Communications, Inc., Sacramento, CA (US)

( * ) Notice: Subject to any disclaimer, the term of this patent is extended or adjusted under 35 U.S.C. 154(b) by 0 days.

(21) Appl. No.: 09/684,575

(22) Filed: Oct. 6, 2000

Related U.S. Application Data

(63) Continuation of application No. 09/314,088, filed on May 18, 1999, now Pat. No. 6,154,075.

(51) Int. Cl.$^7$ ................................................. H03K 5/13
(52) U.S. Cl. ........................ 327/170; 327/263; 327/291
(58) Field of Search ................................ 327/170, 172, 327/261, 262, 263, 264, 291

(56) References Cited

U.S. PATENT DOCUMENTS

| | | | | |
|---|---|---|---|---|
| 4,415,861 A | * | 11/1983 | Palmquist et al. | 307/106 |
| 4,766,328 A | * | 8/1988 | Yang | 327/176 |
| 5,428,313 A | * | 6/1995 | Janosik | 327/362 |
| 5,886,554 A | * | 3/1999 | Corsi et al. | 327/170 |
| 5,982,207 A | * | 11/1999 | Wilcox | 327/112 |

* cited by examiner

Primary Examiner—Tuan T. Lam
(74) Attorney, Agent, or Firm—Merchant & Gould P.C.

(57) ABSTRACT

The invention relates in general to error correcting programmable pulse generator, and more particularly to a programmable pulse generator that removes errors due to manufacturing tolerances, power supply variation, and temperature. A method of modifying a signal from a source includes generating a signal and varying a first and second impedance to control the rise and fall time and average level of the signal to produce an output signal, wherein a plurality of voltage levels are modified. Then, varying a first reference current to produce a second reference current that provides a source for a plurality of currents, wherein the plurality of currents includes a first current, a second current and a third current. In addition, scaling the second reference current producing the first current, second current and third current to correct the plurality of modified voltage levels, wherein errors induced by an external environment and manufacturing tolerances are reduced.

22 Claims, 7 Drawing Sheets

ERROR CORRECTING PROGRAMMABLE PULSE GENERATOR

This application is a continuation of application Ser. No. 09/314,088, filed May 18, 1999, now U.S. Pat. No. 6,154,075, which application(s) are incorporated herein by reference.

BACKGROUND OF THE INVENTION

1. Field of the Invention

This invention relates in general to an error correcting programmable pulse generator, and more particularly to a programmable pulse generator that removes errors due to manufacturing tolerances, power supply variations, and temperature.

2. Description of Related Art

Today's wireless communications markets are being driven by a multitude of user benefits. Products such as cellular phones, cordless phones, pagers, and the like have freed corporate and individual users from their desks and homes and are driving the demand for additional equipment and systems to increase their utility. As a result digital radio personal communications devices will play an increasingly important role in the overall communications infrastructure in the next decade.

Mixed-signal integration and power management have taken on added importance now that analog and mixed analog-digital ICs have become the fastest-growing segment of the semiconductor industry. Integration strategies for multimedia consoles, cellular telephones and battery-powered portables are being developed, as well as applications for less integrated but highly specialized building blocks that serve multiple markets. These building blocks include pulse generators, data converters, comparators, demodulators, filters, amplifiers and voltage regulators.

One important aspect of electronic devices is the effect of external conditions, such as temperature, imposed on the circuit. In a typical circuit, a voltage can be regulated by controlling its current as a function of the result of the actual voltage output and a predetermined reference voltage. The reference voltage may be constant, but it would be desirable under certain conditions to vary the voltage as a function of temperature or other variables. Nevertheless, there are some key barriers to realizing these desirable conditions.

A large number of integrated circuits are programmable. These circuits are widely used in a variety of programmable devices. Devices such as programmable logic arrays (PAL), integrated fuse logic (IFL), bipolar programmable read only memory (BPROM), erasable programmable read only (EPROM), and other conventional types of circuits require a reference voltage that can vary as a function of temperature, supply and other manufacturing process variations. In a programming process, the integrated circuit programmer must provide a pulse signal that is programmable and will include processes that remove errors due to manuring tolerances, power supply variations, and temperature. Currently this is being accomplished by using different hardware circuits for each logic device. However, this is an uneconomical process.

It can be seen then that there is a need for an error correcting programmable pulse generator that removes errors due to manufacturing tolerances, power supply variation, and temperature.

It can also be seen that there is a need for an error correcting programmable pulse generator that controls amplitude, rise and fall time and the average level of a voltage pulse.

SUMMARY OF THE INVENTION

To overcome the limitations in the prior art described above, and to overcome other limitations that will become apparent upon reading and understanding the present specification, the present invention discloses error correcting programmable pulse generator that removes errors due to manufacturing tolerances, power supply variation, and temperature.

The present invention solves the above-described problems by providing a programmable pulse generator that controls the amplitude, the rise and fall time and the average level of a signal.

A method in accordance with the principles of the present invention includes generating a signal having a rise and fall time; varying a first and a second impedance to control a rise and fall time and an average level of the signal to produce an output signal, wherein varying the first and the second impedance modifies a first current, a second current and a third current. In addition, simultaneously varying a first reference current to produce a second reference current that is used to generate the first current, the second current and the third current. Further, simultaneously scaling the second reference current to modify the first current, the second current and the third current to offset by the varying of the first and second impedance to reduce errors induced by an external environment, manufacturing tolerances and a changing time constant.

Other embodiments of a system in accordance with the principles of the invention may include alternative or optional additional aspects. One such aspect of the present invention is that the circuit includes a plurality of registers for scaling the currents.

Another aspect of the present invention is that the controlling of the rise and fall time further includes varying the first and the second impedance to set a time constant, wherein the time constant controls an exponential rise and fall time of the signal.

Another aspect of the present invention is that the varying of the first and the second impedance further includes varying a resistor and a capacitor.

Another aspect of the present invention is that the production of the output signal includes generating a quiescent level when the signal is disabled, wherein the quiescent level is generated by the product of the first current and the first impedance.

Another aspect of the present invention further includes varying a plurality of voltages and a plurality of currents simultaneously.

Another aspect of the present invention is that the first current, second current, and third current are independent of the time constant, a power supply, a manufacturing process, and environmental conditions.

Another aspect of the present invention is that the output signal further includes buffering such that circuits driven by the output do not change the time constant by adding capacitance.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The primary design issues of a programmable pulse generator is to allow a compact, power-efficient generation of fully programmable voltage pulses that are compensated for supply, temperature and process variations. The advantages to this design are compactness, power efficiency, and programmability.

Figure 1:
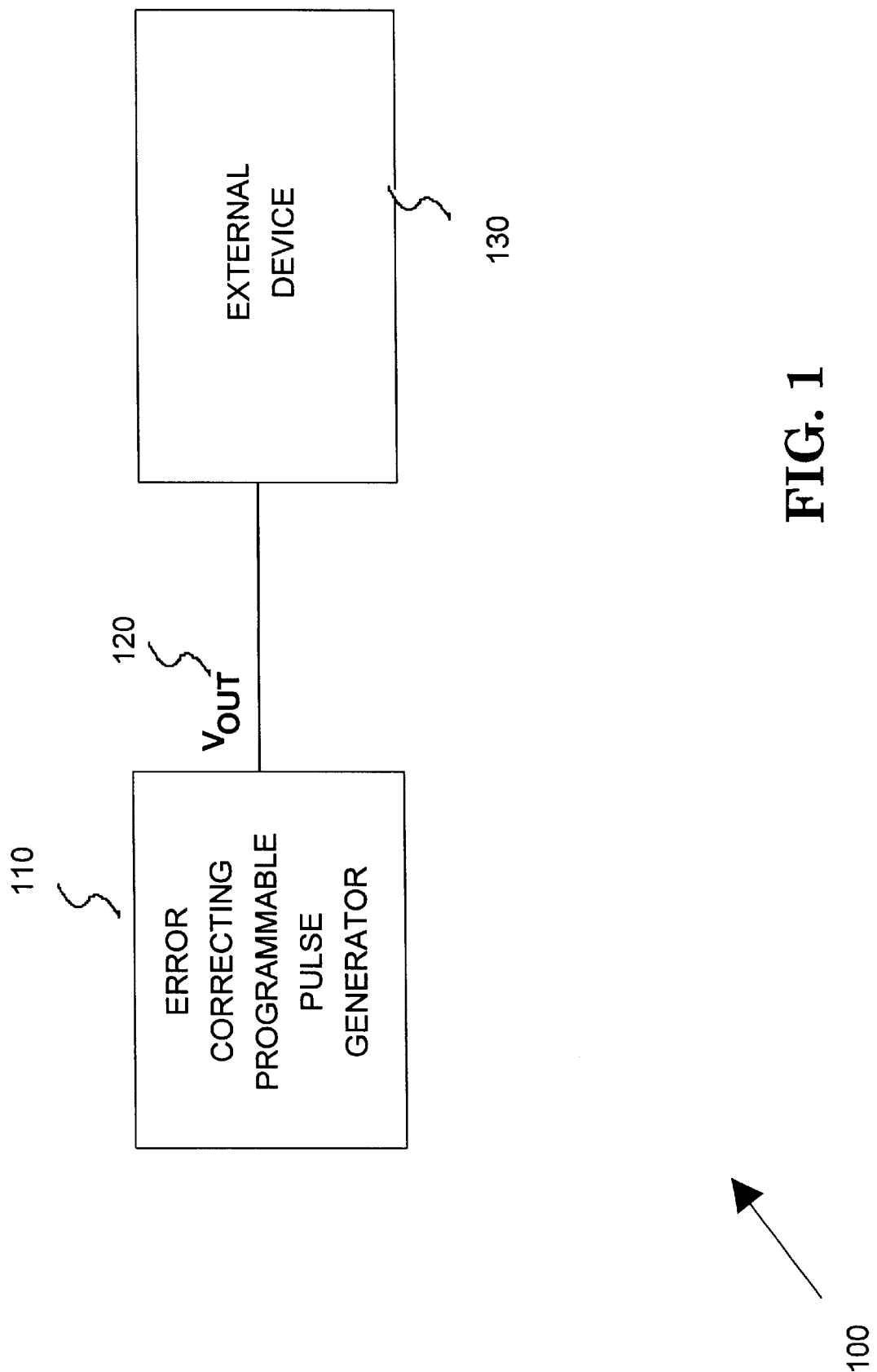
FIG. 1 is an exemplary diagram showing the error correcting programmable pulse generator in a typical system.

FIG. 1 is an exemplary diagram showing the programmable pulse generator in a typical circuit 100 according to the present invention. The programmable pulse generator 110 generates a voltage pulse with controlled signal amplitude, rise and fall time, and average level, in response to a triggered signal. The output signal 120 from the pulse generator 110 is the input signal to an external device 130. The programmable pulse generator 110 removes errors due to manufacturing tolerances, power supply variation, and temperature in the output signal 120.

Figure 2:
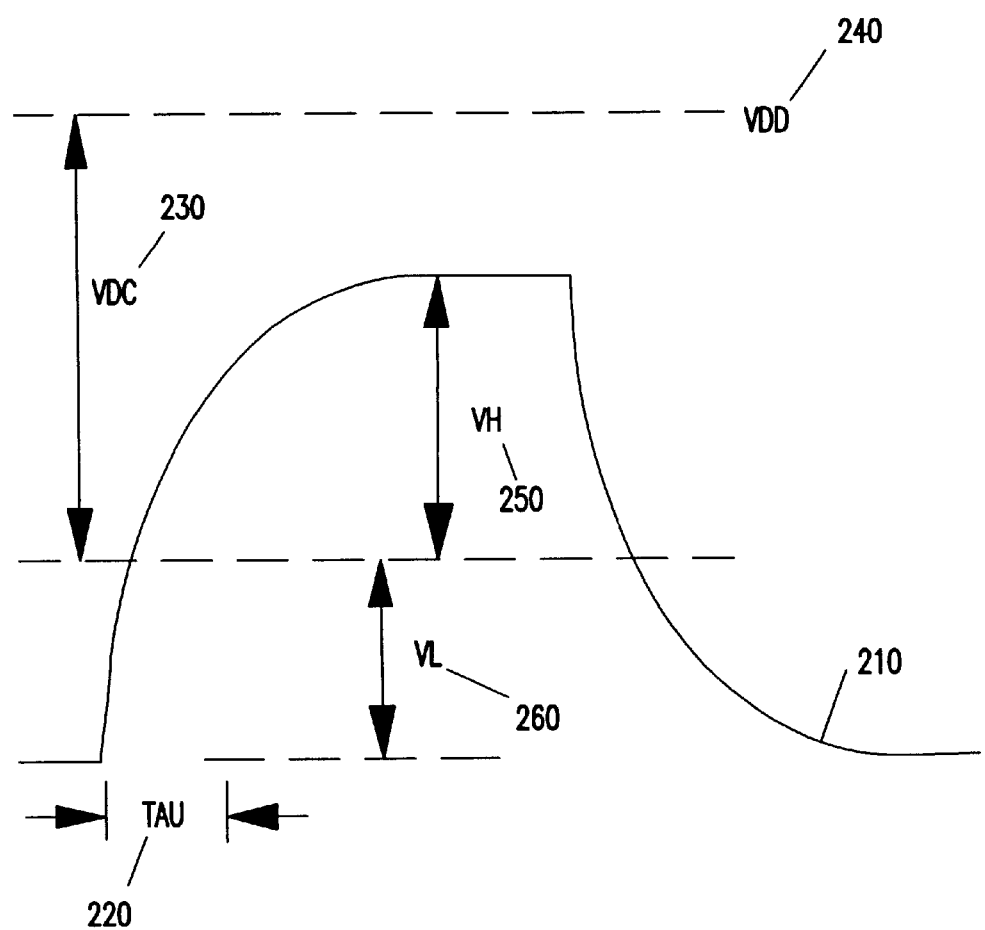
FIG. 2 illustrates the error correcting programmable pulse generator waveform.

FIG. 2 illustrates the error correcting programmable pulse generator waveform 200 according to the present invention. The diagram displays relevant parameters and parameters that can be controlled. A time constant (TAU) 220 represents an exponential rise or fall time of a generated signal 210. A quiescent level (VDC) 230 is the period when pulsing is disabled even though the circuit is energized with respect to the power supply (VDD) 240. High voltage (VH) 250 and low voltage (VL) 260 are the high and low excursions from the quiescent level 230 respectively, and are not necessarily the same.

An essential part of the invention is the ability of controlling all parameters simultaneously. A resistor (R) and a capacitor (C) are programmable via switched elements controlled by digital registers. The product of the resistor and the capacitor sets the exponential rise and fall time of the signal 210. The resistor is programmed once after manufacturing to remove random or systematic errors due to process variation. The capacitor is similarly variable, to allow programming by the user. A product of the resistor (R) and a current source (I) sets the quiescent level 230, the high voltage (VH) 250 and the low voltage (VL) 260. Thus, the current source is switched quickly to one of three values depending on the external trigger and enables a plurality of signals, while the resulting output voltage (VOUT) has the desired waveform 210.

Figure 3:
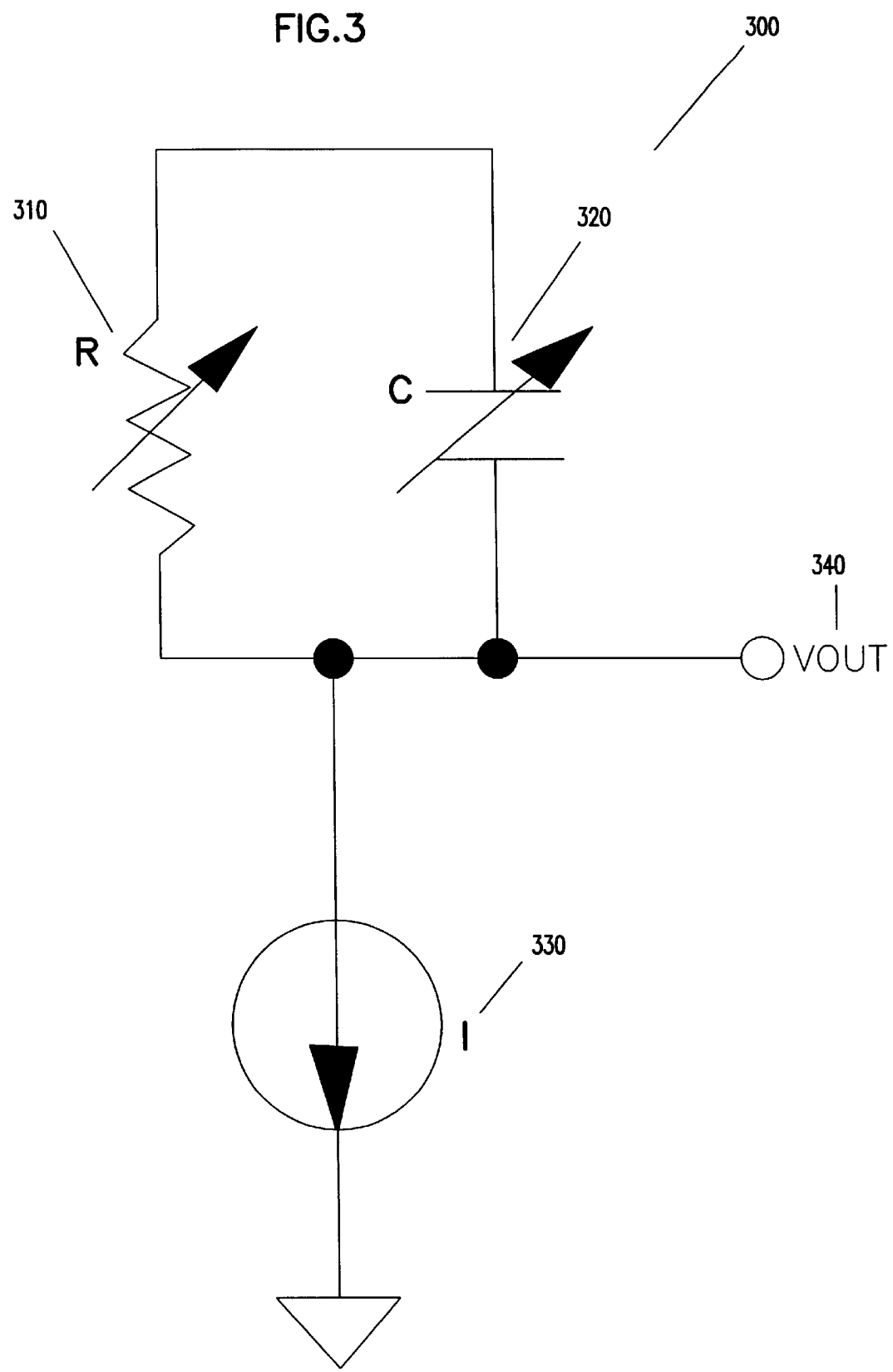
FIG. 3 is diagram of the error correcting programmable pulse generator circuit.

FIG. 3 is diagram of the error correcting programmable pulse generator circuit 300 according to the present invention. A first impedance (resistor, R) 310 and a second impedance (capacitor, C) 320 are programmable via switched elements controlled by digital registers. The product of the first impedance 310 and the second impedance 320 controls the exponential rise and fall time of the output signal (VOUT) 340. A current source (I) 330 is composed of three parts, a first current (quiescent current, IDC), a second current (low current, IL) and third current (high current, IH). These currents are switched instantaneously, while output signal's (VOUT) 340 changes are constrained by the first impedance 310 and the second impedance 320.

Figure 4:
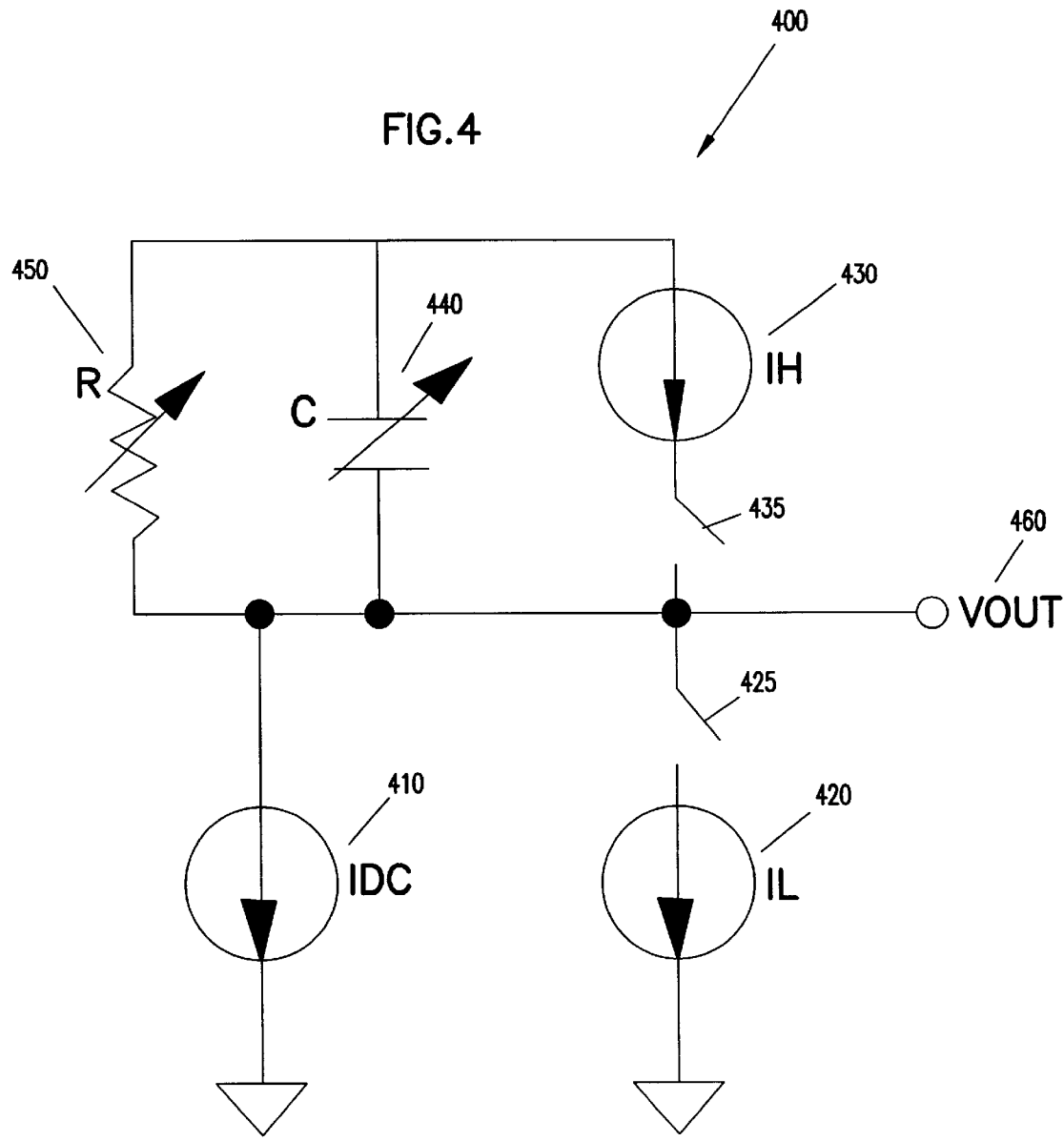
FIG. 4 is a detailed diagram of the error correcting programmable pulse generator circuit.

FIG. 4 is a detailed diagram of the error correcting programmable pulse generator circuit 400 according to the present invention. The current source is composed of three parts, first current (IDC) 410, second current (IL) 420 and the third current (IH) 430, and is used to form the quiescent output (VDC). The quiescent output is formed when the second current (IL) 420 and the third current (IH) 430 are turned off, via switches 425,435 respectively, and the third current (IDC) then flows through the first impedance (R) 450 according to the following equation:

$$VOUT=VDD-(IDC*R)=VDD-VDC \qquad [1]$$

where VDD is the power supply voltage, IDC is the first current (quiescent current), R is the first impedance and VDC is the voltage across the quiescent current source.

To form the low voltage (VL), IL 420 is turned on and added to IDC 410 according to the following equation:

$$VOUT=VDD-(IDC+IL)*R=VDD-VDC-VL \qquad [2]$$

Similarly, VH is formed by "subtracting" IH 430 from IDC 410 according to the following equation:

$$VOUT=VDD-(IDC-IH)*R=VDD-VDC+VH \qquad [3]$$

Again, currents are switched insantaneously, while VOUT's 460 changes are constrained by the first impedance (R) 450 and the second impedance (C) 440.

Figure 5:
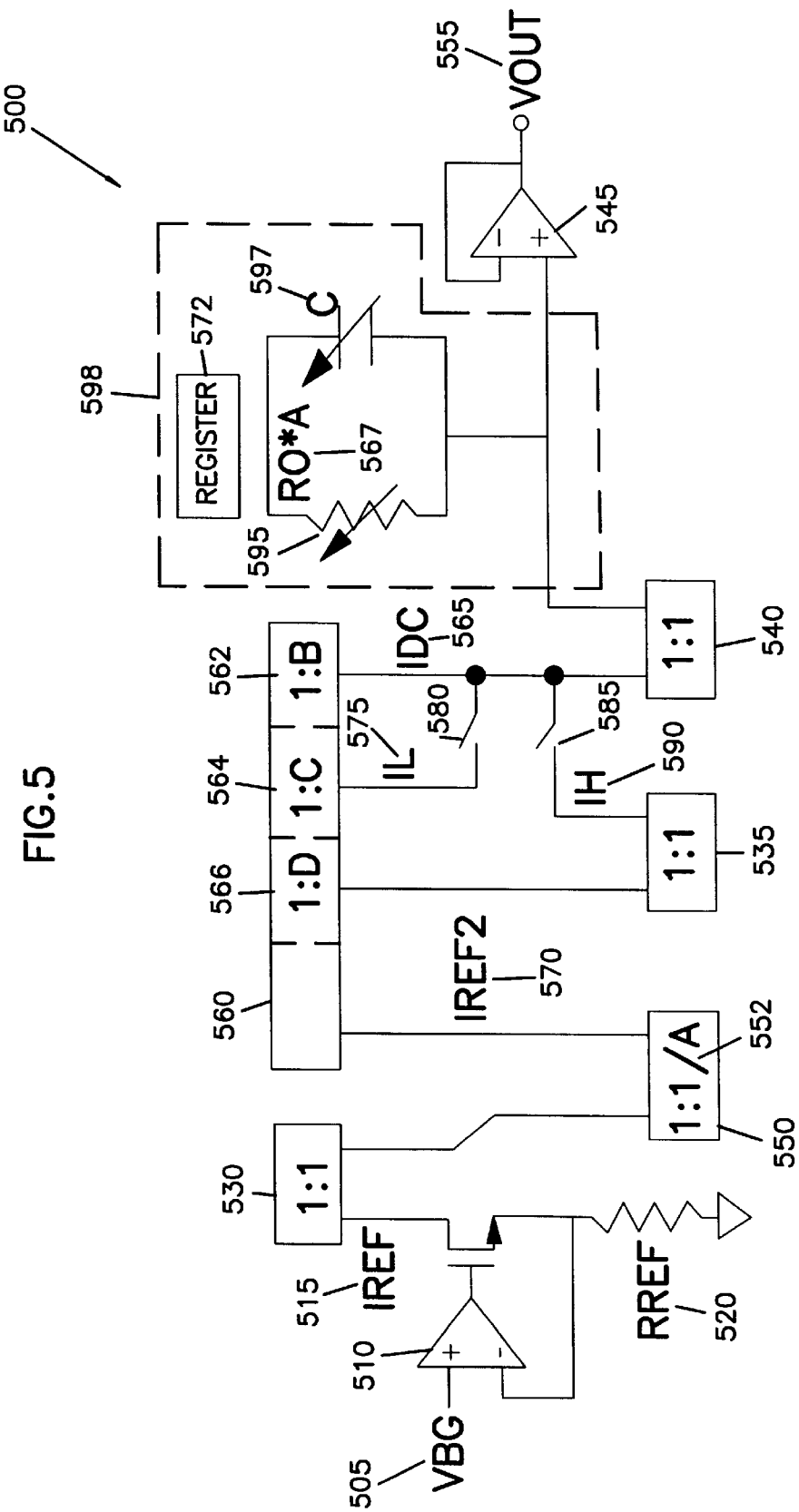
FIG. 5 illustrates the programmable register section of the error correcting programmable pulse generator circuit.

FIG. 5 illustrates the programmable register section the error correcting programmable pulse generator circuit 500 according to the present invention. Another essential part of the invention is the process of generating I (comprised of IL 575, IH 590 and IDC 565) such that VDC, VH and VL are independent of the voltage supply, process, temperature and the time constant (TAU); an embodiment of a full architecture schematic is shown in FIG. 5.

Supply and temperature independence are achieved by imposing bandgap reference voltage (VBG) 505 via a bandgap buffer circuit 510 across on-chip resistor (RREF) 520, and using the resulting first reference current (IREF) 515 as the reference from which all other currents are formed. Since the output resistor R (refer to FIG. 4), is made of the same material as the on-chip resistor (RREF) 520 and has similar geometry, temperature and process variations are reduced. What remains is a reduction of errors caused by programming the first impedance (R) 595 to set the rise and fall time constant (TAU).

Changing R (refer to FIG. 4) by scaling the first impedance (R) 595 by some factor A 567, by programming a third register 572 in the modifying circuit 598, would scale VDC, VL and VH, which is undesirable. The solution is to scale a first reference current (IREF) 515 by 1/A 552, using a first register 550, to form a second reference current (IREF2) 570. IDC 565, IL 575 and IH 590 are then formed by scaling IREF2 570 by programmable factors B 562, C 564, and D 566 respectively, using a second register 560, and the factor A 567 is canceled. Toggling a second and a third current switch 580, 585 may vary the current. Finally, the output 555 is buffered 545 such that circuits driven by VOUT 555 do not change the time constant (TAU) by adding capacitance in parallel with C 597.

Figure 6:
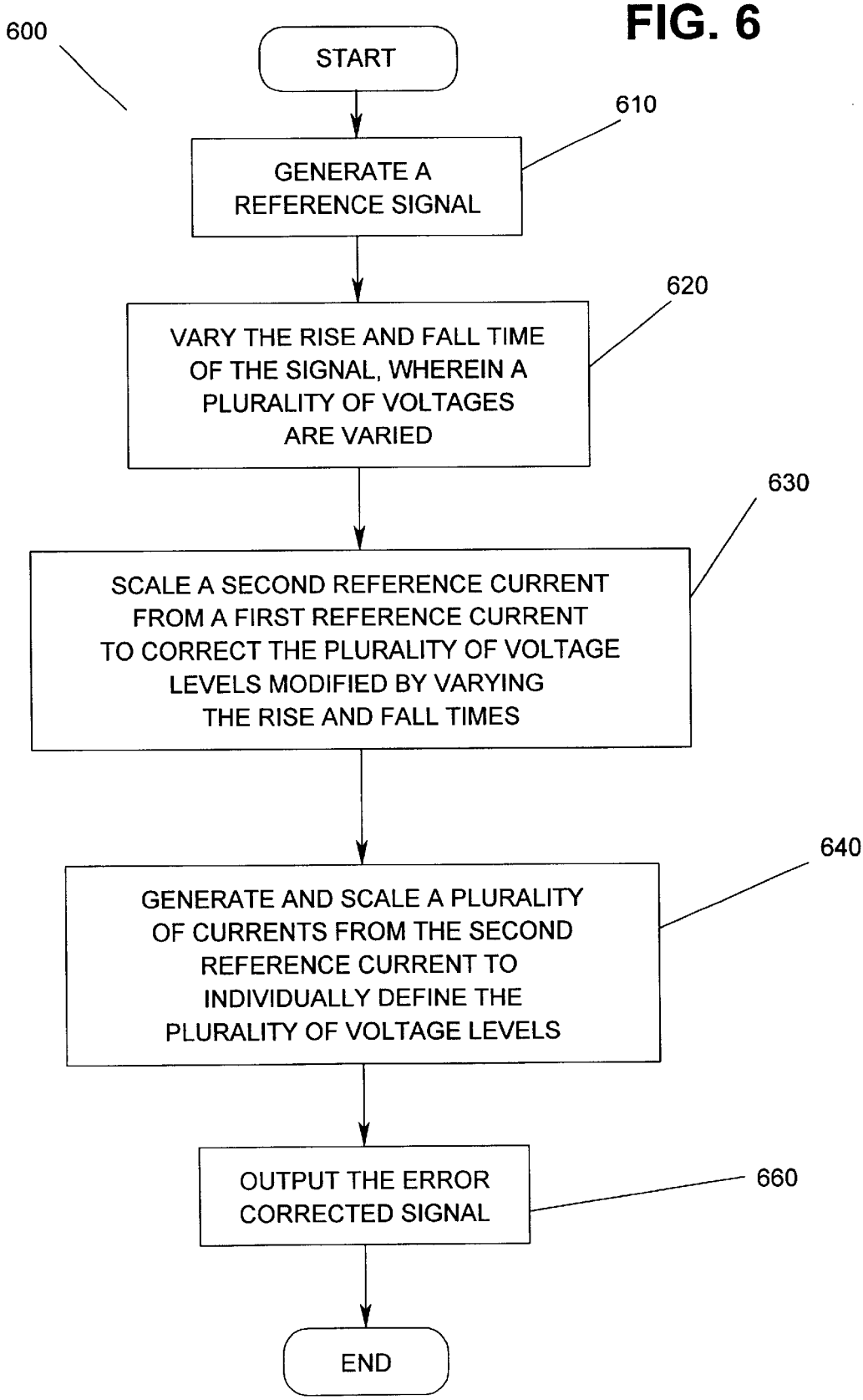
FIG. 6 is a flow diagram illustrating a method of the error correcting programmable pulse generator circuit according to the present invention.

FIG. 6 is a flow diagram illustrating a method of the error correcting programmable pulse generator circuit 600 according to the present invention. A generated signal is modified to reduce temperature and manufacturing process variations 610. Controlling all parameters simultaneously is an essential part of the circuit. The rise and fall time of the signal is possible by controlling the first impedance (resistor, R) and the second impedance (capacitor, C), which are programmable via switched elements controlled by digital registers. The product R and C controls the exponential rise and fall time, which varies a plurality of voltage levels 620.

Supply and temperature independence are achieved by imposing bandgap reference voltage (VBG) across an on-chip resistor (RREF), and using the resulting first reference current (IREF) as the reference from which all other currents are formed. Thus, a second reference current is scaled from the first reference current to correct the plurality of voltage levels modified by varying the rise and fall times 630. Then a plurality of currents are generated and scaled from the second reference current to individually define the plurality of voltage levels 640.

Finally, the output is buffered generating a voltage pulse with controlled amplitude, rise and fall time, and average level, in response to a trigger signal. The technique includes the reduction of errors due to manufacturing tolerances, power supply variation, and temperature 660.

Figure 7:
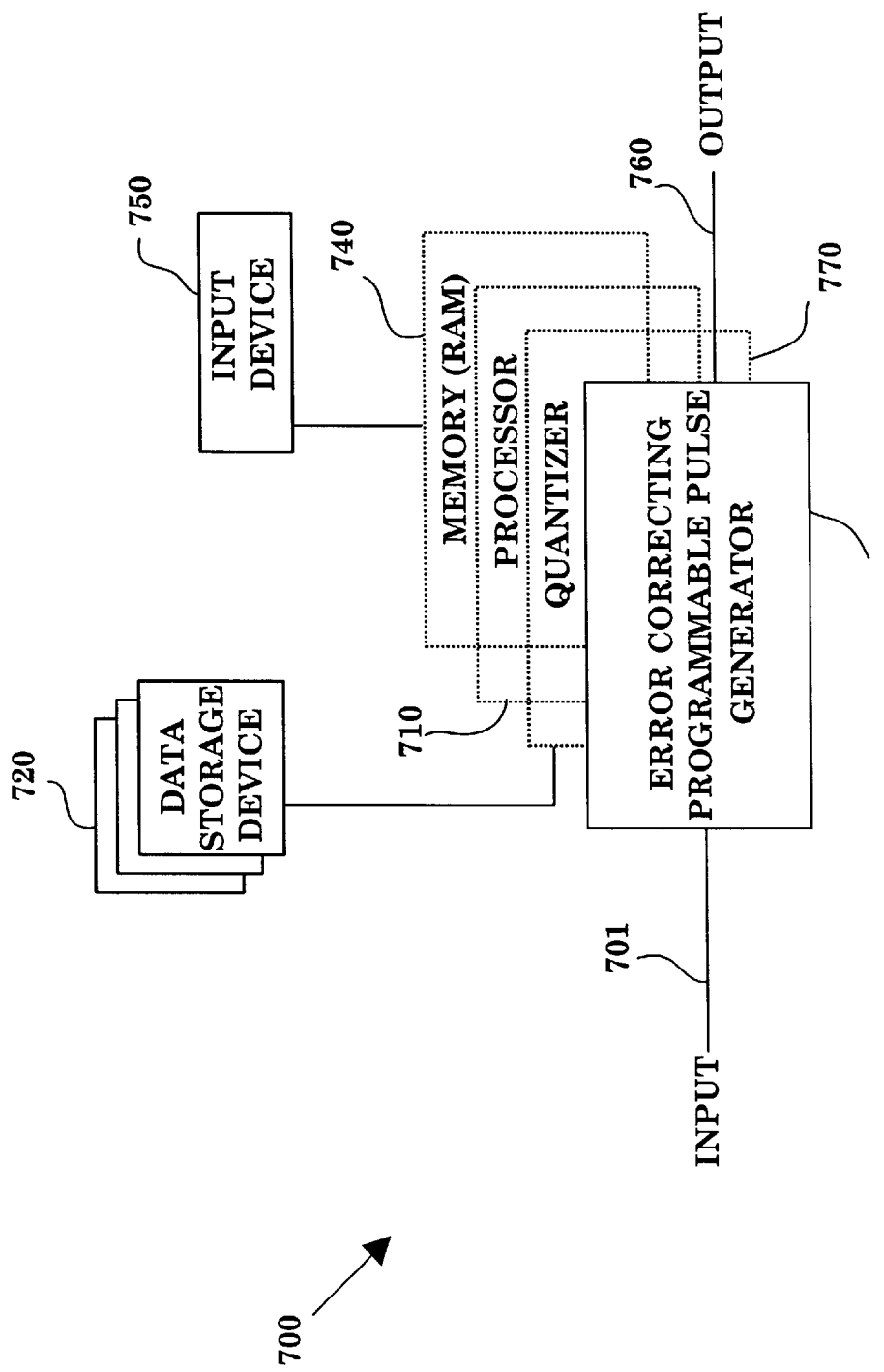
FIG. 7 is an exemplary hardware environment for the error correcting programmable pulse generator circuit.

Referring to FIG. 7, another hardware environment for modifying a signal from a source is shown 700 according to the present invention. The present invention may be implemented using an error correcting programmable pulse generator 730, comprised of a processor 710 and memory (RAM) 740. It is envisioned that attached to the generator 730 may be a memory device 740. Also included in this embodiment may be input devices 750, for downloading data and commands.

The generator 730 may operate under the control of an operating system. The generator 730 executes one or more computer programs under the control of the operating system.

Generally, the operating system and the generator programs may be tangibly embodied in a computer-readable medium or carrier, e.g. one or more of the fixed or removable data storage devices 720, or other data storage or data communications devices. A quantizer 770 may be used for conversion or the analog signals to digital between the error correcting programmable pulse generator 730 and any connecting digital device. Both operating system and the computer programs may be loaded from the data storage devices into the memory 740 of the generator 730 for execution by the processor 710. Those skilled in the art will recognize that the memory 740 is optional, or may be a memory device embedded or otherwise coupled to the error correcting programmable pulse generator 730. Both the operating system and the generator programs comprise instructions which, when read and executed by the processor 710, cause the generator to perform the steps necessary to execute the steps or elements of the present invention. The resulting digital output 760 is produced.

Although one detector system configuration is illustrated in FIG. 7, those skilled in the art will recognize that any number of different configurations performing similar functions may be used in accordance with the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method of generating a signal having a controllable rise and fall time, comprising:

varying a first impedance and a second impedance to control the rise and fall time and an average level of the signal, wherein varying the first impedance and the second impedance modifies a first current level, a second current level, and a third current level and their associated voltage levels;

producing a second reference current, the second reference current being used for generating the first current, the second current, and the third current; and scaling the second reference current to modify the first current, the second current, and the third current to offset the varying of the first impedance and the second impedance to reduce errors induced by an external environment, manufacturing tolerances and a changing time constant.

2. The method of claim 1 further comprising a plurality of registers for scaling the first, second, and third currents, wherein a first reference current is scaled to produce the second reference current.

3. The method of claim 1, wherein the controlling the rise and fall time further comprises varying the first impedance and the second impedance to set the time constant, wherein the time constant controls an exponential rise and fall time of the signal.

4. The method of claim 3, wherein the varying the first impedance and the second impedance further comprises varying a resistor and a capacitor.

5. The method of claim 1, wherein the varying the first impedance and the second impedance comprises generating a quiescent level when the signal is disabled, wherein the quiescent level is generated by the product of the first current and the first impedance.

6. The method of claim 1, wherein the first current, second current, and third current are independent of the time constant, a power supply, a manufacturing process, and environmental conditions.

7. The method of claim 1, wherein the controlling the rise and fall time of the signal further comprises generating an output signal that is buffered such that circuits driven by the output signal do not change the time constant by adding capacitance.

8. A pulse generator for generating a signal having a rise and fall time, comprising:

a modifying circuit for varying a first impedance and a second impedance to control the rise and fall time and an average level of the signal, wherein varying the first impedance and the second impedance modifies a first current, a second current, and a third current and their associated voltage levels;

a first register, coupled to a signal generator, for producing a second reference current, the second reference current being used for generating the first current, the second current, and the third current; and a second register, coupled to the first register and the modifying circuit, to scale the second reference current modifying the first current, the second current, and the third current to offset the varying of the first impedance and the second impedance to reduce errors induced by an external environment, manufacturing tolerances and a changing time constant.

9. The pulse generator of claim 8 further comprising a plurality of registers for scaling the first, second, and third currents, wherein a first reference current is scaled to produce the second reference current.

10. The pulse generator of claim 8, wherein the modifying circuit further comprises a third register for varying the first impedance and the second impedance to set a time constant, wherein the time constant controls an exponential rise and fall time of the signal.

11. The pulse generator of claim 10, wherein the modifying circuit further comprises a resistor and a capacitor for varying the rise and fall time of the signal.

12. The pulse generator of claim 8, wherein the varying the first impedance and the second impedance generates a quiescent level when the signal is disabled, wherein the quiescent level is generated by the product of the first current and the first impedance.

13. The pulse generator of claim 8, wherein the second reference current, the first current, the second current, and the third current are independent of the time constant, a power supply, a manufacturing process, and environmental conditions.

14. The pulse generator of claim 8, wherein the controlling the rise and fall time of the signal further comprises a buffer for generating an output signal such that circuits driven by the output signal do not change the time constant by adding capacitance.

15. A system for generating a signal having a rise and fall time, comprising:

a pulse generator for generating a signal having the rise and fall time, comprising:

a modifying circuit for varying a first impedance and a second impedance to control the rise and fall time and an average level of the signal, wherein varying the first impedance and the second impedance modifies a first current, a second current, and a third current and their associated voltage levels;

a first register, coupled to a signal generator, for producing a second reference current, the second reference current being used for generating the first current, the second current, and the third current;

a second register, coupled to the first register and the modifying circuit, to scale the second reference current modifying the first current, the second current, and the third current to offset the varying of the first impedance and the second impedance to reduce errors induced by an external environment, manufacturing tolerances and a changing time constant; and an external device to receive the signal.

16. The system of claim 15 further comprising a plurality of registers for scaling the first, second, and third currents, wherein a first reference current is scaled to produce the second reference current.

17. The system of claim 15, wherein the modifying circuit further comprises a third register for varying the first impedance and the second impedance to set a time constant, wherein the time constant controls an exponential rise and fall time of the signal.

18. The system of claim 17, wherein the first impedance and the second impedance comprise a resistor and a capacitor, respectively, for varying the rise and fall time of the signal.

19. The system of claim 15, wherein the varying of the first impedance and the second impedance generates a quiescent level when the signal is disabled, wherein the quiescent level is generated by the product of the first current and the first impedance.

20. The system of claim 15, wherein the second reference current, the first current, the second current, and the third current that are independent of the time constant, a power supply, a manufacturing process, and environmental conditions.

21. The system of claim 15, wherein the controlling the rise and fall time of the signal further comprises a buffer for generating an output signal such that the external device driven by the output signal do not change the time constant by adding capacitance.

22. An article of manufacture for providing error correcting programmable pulse generator, the article of manufacture comprising a computer readable medium having instructions for generating a signal having a controllable rise and fall time, comprising:

varying a first impedance and a second impedance to control the rise and fall time and an average level of the signal, wherein varying the first impedance and the second impedance modifies a first current, a second current, and a third current level and their associated voltage levels;

varying a first reference current to produce a second reference current that is used to generate the first current, the second current, and the third current; and scaling the second reference current to modify the first current, the second current, and the third current to offset the varying of the first impedance and the second impedance to reduce errors induced by an external environment, manufacturing tolerances and a changing time constant.

* * * * *